(12) United States Patent
Hao et al.

(10) Patent No.: US 7,824,960 B2
(45) Date of Patent: Nov. 2, 2010

(54) METHOD OF ASSEMBLING A SILICON STACK SEMICONDUCTOR PACKAGE

(75) Inventors: Liu Hao, Singapore (SG); Ravi Kanth Kolan, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 156 days.

(21) Appl. No.: 12/124,830

(22) Filed: May 21, 2008

(65) Prior Publication Data

US 2008/0293186 A1 Nov. 27, 2008

Related U.S. Application Data

(60) Provisional application No. 60/924,585, filed on May 22, 2007.

(51) Int. Cl.
*H01L 21/00* (2006.01)
(52) U.S. Cl. .............. 438/109; 438/118; 438/667; 257/E21.514; 257/E21.506; 257/E21.51
(58) Field of Classification Search .............. 438/109, 438/667, 118; 257/E21.514, E21.506, E21.51
See application file for complete search history.

(56) References Cited

U.S. PATENT DOCUMENTS

| | | | |
|---|---|---|---|
| 6,461,881 B1 | 10/2002 | Farnworth et al. | |
| 6,577,013 B1 * | 6/2003 | Glenn et al. | 257/777 |
| 7,160,757 B2 | 1/2007 | Narkhede et al. | |
| 2002/0074637 A1 | 6/2002 | McFarland | |
| 2004/0241907 A1 * | 12/2004 | Higashino et al. | 438/109 |
| 2005/0280160 A1 * | 12/2005 | Kim et al. | 257/777 |
| 2006/0270104 A1 | 11/2006 | Trovarelli et al. | |

* cited by examiner

*Primary Examiner*—Caridad M Everhart
(74) *Attorney, Agent, or Firm*—Sughrue Mion, PLLC

(57) ABSTRACT

A method of manufacturing a plurality of stacked die semiconductor packages, including: placing a phase change material between a top surface of a substrate and a bottom surface of a first die; placing a phase change material between a top surface of the first die and a bottom surface of a second die; wherein the first and second dies have a plurality of conductive protrusions on the bottom surfaces of the dies; wherein the first die has a plurality of conductive vias extending from its conductive protrusions, through the first die, to the top surface of the first die; wherein the conductive vias of said first die are in alignment with the conductive protrusions of the second die; and heating the dies and the substrate to cause the second die to become electrically interconnected to the first die and the first die to become electrically connected to the substrate.

19 Claims, 2 Drawing Sheets

METHOD OF ASSEMBLING A SILICON STACK SEMICONDUCTOR PACKAGE

CROSS-REFERENCE TO RELATED APPLICATIONS

This application claims priority from U.S. Provisional Application No. 60/924,585 filed on May 22, 2007, the disclosure of which is incorporated herein by reference.

BACKGROUND OF INVENTION

1. Field of Invention

Methods consistent with the present invention relate to a silicon stacked semiconductor package. More particularly, the method relates to a one time reflow process for through-silicon vias (TSV) interconnect 3-D packages. The method uses phase change materials for support pins that either vaporize or cure.

2. Background and Description of the Related Art

The relatively new through-silicon vias, or TSV, technique involves stacking chips/dies vertically in a package and then creating connections between the bottom of the top chip and the top of the bottom chip.

Conventional TSV packages contain interposers, spacers and/or gap control structures between the stacked dies and substrate. Reflow processes are performed to solidify solder bumps between the dies and substrate. In addition, often times, post-curing is required to completely harden the interposers, spacers and/or gap control structures. One problem with multiple reflows is that it may cause reliability issues with the solder bumps. Another problem is that multiple reflows increase the manufacturing time.

One convention method is disclosed in U.S. Pat. No. 7,160,757. In this patent, you position the interposer, first solder bumps and gap control structure on the substrate and then reflow to solidify the first solder bumps and the gap control structure. Next, you attach the die and second solder bumps on the interposer and reflow to solidify 2nd solder bumps. The gap control structure prevents the collapse of first solder bumps during the second reflow process. However, the method does not use epoxy support pins to stack chips on the substrate. Instead, it uses a combination of the interposer with solder bumps and gap control structures to stack the chip onto substrate. In addition, it does not use a one-time reflow process, rather separate reflows required to couple interposer to substrate and to couple flip chip onto interposer.

Another convention method is disclosed in U.S. Pat. No. 6,461,881. In this patent, spacers are provided on an active surface of a semiconductor device having solder bumps. The spacers can be made of partially cured epoxy. During reflow, the spacers maintain uniform distance between substrate and semiconductor device while the solder balls bond to the contact pads on the substrate. Post-curing completely hardens the spacers. However, the method uses spacers (support pins) to stack chip onto substrate, but does not use spacers to stack chip on chip. Also, it does not use a one-time reflow process. Instead reflow only causes solder ball attachment. In addition, post curing required to completely harden the spacers.

Another convention method is disclosed in U.S. Patent Publication No. 2006/0270104A1. In this publication, interposers are provided between two dies or between the substrate and die. The interposer can be made of an adhesive material. Heating cures the interposers (adhesive material), thereby coupling the two dies together. However, although the method uses adhesive interposers (support pins) to stack chip onto chip/substrate, it does not have a single reflow process for both solder ball attachment and curing of interposers.

Another convention method is disclosed in U.S. Patent Publication No. 2002/0074637A1. In this publication, flip chips are stacked such that the chips are electrically connected to one another by means of conductive bumps and conductive redistribution traces. Underfill material is provided between the chips to mechanically retain the chips in place. However, the method does not use support pins to stack the chip on the substrate or chip on the chip. Instead, it use underfill material to hold the chips in place. In addition, the reflow process only causes solder ball attachment, as no support pins are used.

It is an object of the invention to provide a process to reflow the solder bumps while keeping the stacked chips in alignment with each other.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

In an embodiment of the invention, a one-time reflow process is used to both reflow the solder bumps and cure or vaporize the support structures.

In a first aspect, there is provided a method of manufacturing a assembling a stacked semiconductor package, that includes the following steps:

placing a phase change material, such as epoxy, between a top surface of a substrate and a bottom surface of a first semiconductor die;

placing a phase change material between a top surface of the first semiconductor die and a bottom surface of a second semiconductor die;

wherein the first and second semiconductor dies have a plurality of conductive protrusions on the bottom surfaces of the dies;

wherein the first semiconductor die has a plurality of conductive vias extending from its conductive protrusions, through the first semiconductor die, to the top surface of the first semiconductor die;

wherein the conductive vias of said first semiconductor die are in alignment with the conductive protrusions of the second semiconductor die; and heating the semiconductor dies and the substrate to cause the second semiconductor die to become electrically interconnected to the first semiconductor die and the first semiconductor die to become electrically connected to the substrate.

During the heating step, in one embodiment, the phase change material cures. In another embodiment, during heating, the phase change material evaporates.

In another aspect of the invention, the diameter of the conductive protrusions is reduced during the heating step.

In one aspect of the invention, the phase change materials are placed at the corners of the dies. In another aspect, phase change materials are placed at outer edges of said first and second semiconductor dies.

In another aspect of the invention, the semiconductor dies and substrate can be encapsulated.

BRIEF DESCRIPTION OF THE DRAWINGS

The above and/or other aspects of the present invention will become apparent and more readily appreciated from the following description of the exemplary embodiments, taken in conjunction with the accompanying drawings, in which.

DETAILED DESCRIPTION OF EXEMPLARY EMBODIMENTS OF THE INVENTION

Hereinafter, exemplary embodiments of the present invention will be described with reference to the accompanying drawings.

A novel feature of this invention is that it uses a reflow process to reflow the solder bumps while keeping the stacked chips in alignment with each other. This can be achieved through the use of support structures formed from a phase change material which is adhesive enough to hold the stacked dies in place during stacking and reflow. The phase change material may eventually cure or evaporate during or at the end of the reflow process. The method results in better reliability and reduces manufacturing times.

Figure 1:
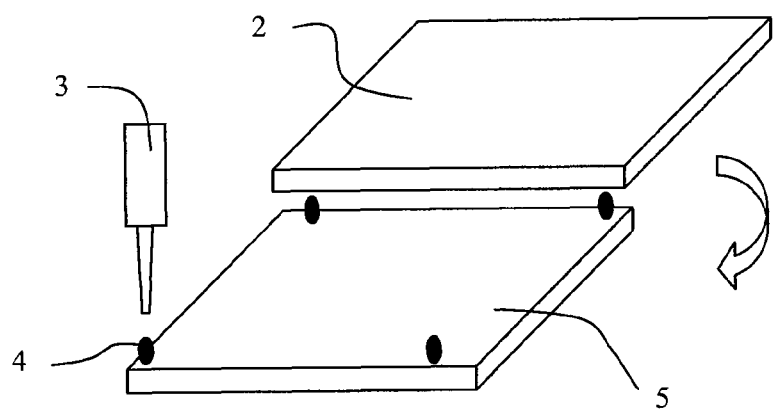
FIG. 1-2 illustrate an embodiment of the inventive method.
Figure 2:
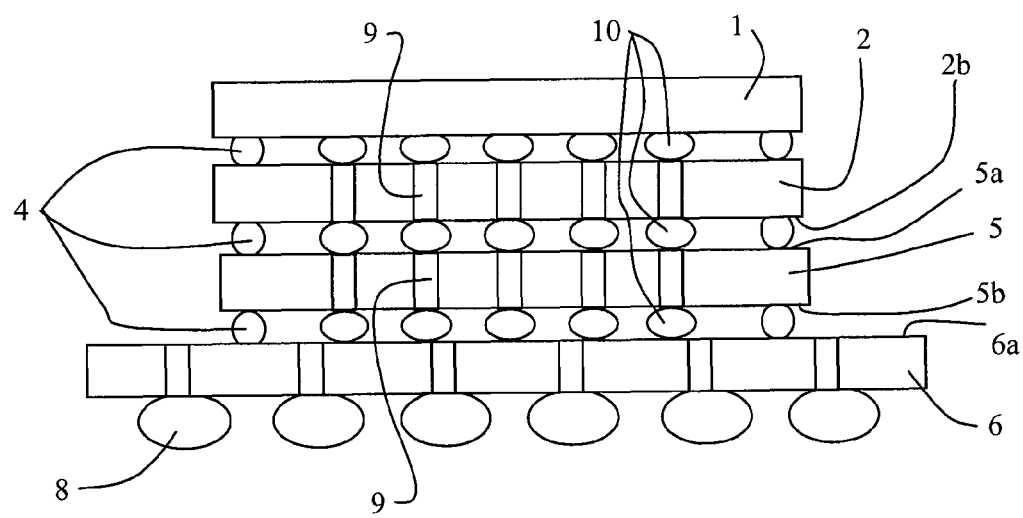

Embodiments of the invention will be describe in connection with FIGS. 1-3. First, a phase change material 4 is placed between a top surface 6a of a substrate 6 and a bottom surface 5b of a first semiconductor die 5. A dispenser 3 can be used to apply the phase change material. An example of a phase change material that can be used is epoxy, tailored to cure or vaporize during reflow temperatures. The phase change material 4 is preferably dispensed to form a height substantially the same as that of conductive protrusions 10.

Next, a phase change material is placed between a top surface 5a of the first semiconductor die 5 and a bottom surface 2b of a second semiconductor die 2. The first and second semiconductor dies 5, 6 have a plurality of conductive protrusions 10 on the bottom surfaces of the dies. These conductive protrusions 10 can be solder balls or bumps. The first semiconductor die also has a plurality of conductive vias 9 extending from its conductive protrusions 10, through the first semiconductor die, to the top surface 5a of the first semiconductor die 5. The conductive vias 9 of said first semiconductor die 5 are in alignment with conductive protrusions 9 in the second semiconductor die 2.

Next the semiconductor dies 2, 5 and the substrate 6 are heated to cause the second semiconductor die 2 to become electrically interconnected to the first semiconductor die 5 and the first semiconductor die 5 to become electrically connected to the substrate 6.

Figure 3A:
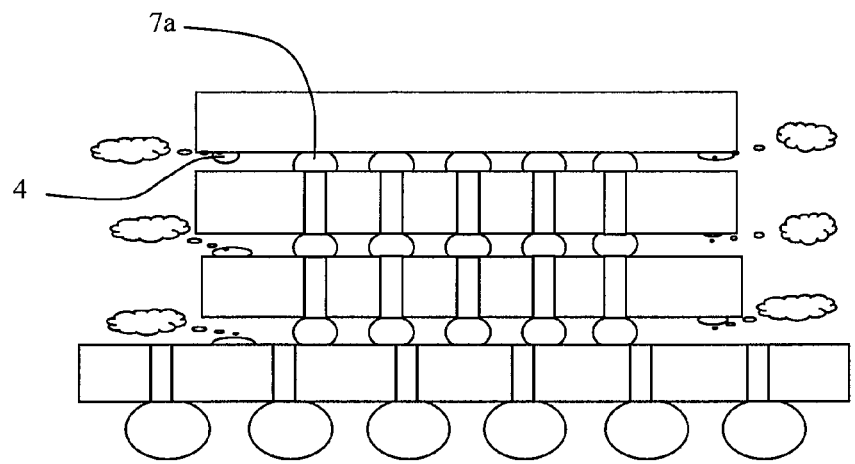
FIGS. 3A and 3B illustrate alternate embodiments of the inventive method.
Figure 3B:
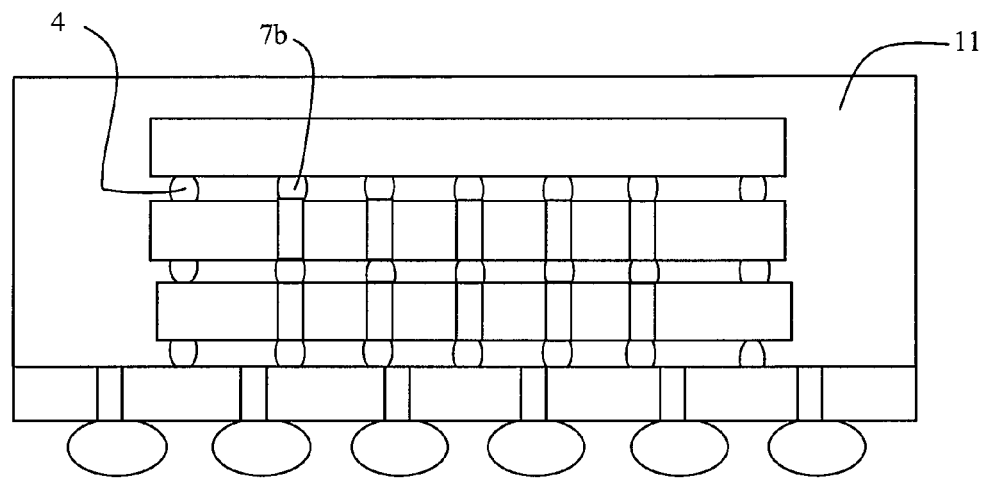

In one embodiment, as shown in FIG. 3A, the heating step is a reflow process which causes the phase change material 4 to evaporate. It will be appreciated that suitable temperatures for the reflow process would depend on the type of phase change materials used, and would be the temperature at the which the phase change material changes into vapor state. It will also be appreciated that the phase change material would have adhesive properties sufficient to hold the stacked dies in place during stacking and reflow, before it vaporizes. In another embodiment, as shown in FIG. 3B, the heating step is a reflow process which causes the phase change material 4 to cure. Again, it will be appreciated that suitable temperatures for the reflow process would depend on the type of phase change materials used, and would be the temperature at the which the phase change material becomes cured. It will also be appreciated that the phase change materials would have adhesive properties sufficient to hold the stacked dies in place during stacking of the dies and during reflow.

Also during the heating step involving reflowing to cure the phase change material, the diameter of the conductive protrusions 7 may be reduced due to the fixed height of the phase change material. See 7b in FIG. 3B.

FIG. 1 shows the phase change material 4 being placed at the corners of the semiconductor dies. The phase change material could also be placed at other locations along the outer edges of the semiconductor dies.

In another embodiment, the stacked dies and substrate can be covered with an encapsulant 11, as shown in FIG. 3B. In yet another embodiment, the space between the first semiconductor die and the substrate, or the space between two semiconductor dies from the stacked dies, may be underfilled prior to encapsulation to protect the conductive protrusions.

The above description refers to packages with two semiconductor dies on a substrate. However, the present invention is also applicable to more than two semiconductor dies. For example, FIGS. 2 and 3 shown an additional third semiconductor die 1.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of assembling a stacked semiconductor package comprising:
   placing a phase change material between a top surface of a substrate and a bottom surface of a first semiconductor die;
   placing a phase change material between a top surface of said first semiconductor die and a bottom surface of a second semiconductor die;
   wherein said first and second semiconductor dies have a plurality of conductive protrusions on said bottom surfaces of said dies;
   wherein said first semiconductor die has a plurality of conductive vias extending from its conductive protrusions, through the first semiconductor die, to the top surface of the first semiconductor die;
   wherein said conductive vias of said first semiconductor die are in alignment with the conductive protrusions of the second semiconductor die; and
   after placing said phase change materials, heating said semiconductor dies and said substrate to cause said second semiconductor die to become electrically interconnected to said first semiconductor die and said first semiconductor die to become electrically connected to said substrate.

2. The method of claim 1, wherein said phase change materials evaporate during the heating step.

3. The method of claim 1, wherein said phase change materials cure during the heating step.

4. The method of claim 1, wherein said phase change materials are placed at the corners of said first and second semiconductor dies.

5. The method of claim 1, wherein said phase change materials are placed at outer edges of said first and second semiconductor dies.

6. The method of claim 1, wherein said phase change material is epoxy.

7. The method of claim 1, wherein said heating step is a high reflow temperature process.

8. The method of claim 1, wherein said conductive protrusions are solder bumps.

9. The method of claim 1, further comprising encapsulating said first and second semiconductor dies and said substrate.

10. The method of claim 1, further comprising:
prior to said heating step, placing a phase change material between a top surface of said second semiconductor die and a bottom surface of a third semiconductor die;
wherein said second semiconductor die has a plurality of conductive vias extending from its conductive protrusions, through the second semiconductor die, to the top surface of the second semiconductor die;
wherein said third semiconductor die has conductive protrusions on a bottom surface which are in alignment with the conductive vias of the second semiconductor die; and
wherein during said heating step said third semiconductor die becomes electrically interconnected to said second semiconductor die.

11. A method of assembling a stacked semiconductor package comprising:
placing a phase change material between a top surface of a substrate and a bottom surface of a first semiconductor die;
placing a phase change material between a top surface of said first semiconductor die and a bottom surface of a second semiconductor die;
wherein said first and second semiconductor dies have a plurality of conductive protrusions on said bottom surfaces of said dies;
wherein said first semiconductor die has a plurality of conductive vias extending from its conductive protrusions, through the first semiconductor die, to the top surface of the first semiconductor die;
wherein said conductive vias of said first semiconductor die are in alignment with the conductive protrusions of the second semiconductor die; and
heating said semiconductor dies and said substrate to cause said second semiconductor die to become electrically interconnected to said first semiconductor die and said first semiconductor die to become electrically connected to said substrate;
wherein the diameter of said conductive protrusions is reduced during the heating step.

12. The method of claim 11, wherein said phase change materials cure during the heating step.

13. The method of claim 11, wherein said phase change materials are placed at the corners of said first and second semiconductor dies.

14. The method of claim 11, wherein said phase change materials are placed at outer edges of said first and second semiconductor dies.

15. The method of claim 11, wherein said phase change material is epoxy.

16. The method of claim 11, wherein said heating step is a high reflow temperature process.

17. The method of claim 11, wherein said conductive protrusions are solder bumps.

18. The method of claim 11, further comprising encapsulating said first and second semiconductor dies and said substrate.

19. The method of claim 11, further comprising:
prior to said heating step, placing a phase change material between a top surface of said second semiconductor die and a bottom surface of a third semiconductor die;
wherein said second semiconductor die has a plurality of conductive vias extending from its conductive protrusions, through the second semiconductor die, to the top surface of the second semiconductor die;
wherein said third semiconductor die has conductive protrusions on a bottom surface which are in alignment with the conductive vias of the second semiconductor die; and
wherein during said heating step said third semiconductor die becomes electrically interconnected to said second semiconductor die.

* * * * *